United States Patent [19]

Uchida

[11] Patent Number: 4,618,550

[45] Date of Patent: Oct. 21, 1986

[54] RESIN PRINTING PLATE AND PREPARATION THEREOF

[75] Inventor: Seiichi Uchida, Moriguchi, Japan

[73] Assignee: Asahi Kasei Kogyo Kabushiki Kaisha, Osaka, Japan

[21] Appl. No.: 822,194

[22] Filed: Jan. 24, 1986

Related U.S. Application Data

[62] Division of Ser. No. 690,550, Jan. 11, 1985.

[30] Foreign Application Priority Data

Jul. 23, 1984 [JP] Japan .............................. 59-154611
Nov. 6, 1984 [JP] Japan ........................... 59-168182[U]

[51] Int. Cl.$^4$ ............................................. G03F 7/02
[52] U.S. Cl. ....................................... 430/11; 430/15
[58] Field of Search ................ 430/5, 11, 15, 22, 306, 430/325, 328

[56] References Cited

U.S. PATENT DOCUMENTS 3,663,222 5/1972 Akamatsu et al. ................... 430/306

FOREIGN PATENT DOCUMENTS 45-23165 8/1970 Japan .
54-32362 10/1979 Japan .

Primary Examiner—Richard L. Schilling
Attorney, Agent, or Firm—Birch, Stewart, Kolasch & Birch

[57] ABSTRACT

A printing plate consisting of a base portion, a mount portion and a relief portion made of a liquid resin which is sensitive to and curable by irradiated activating rays, the plate being prepared by use of a masking sheet formed with a transmitting pattern having a contour corresponding to and slightly larger than the pattern of a negative film, a semi-transmitting pattern positioned outside the transmitting pattern and having a large contour for transmitting irradiated activating rays upon attenuation, and a blocking surface positioned outside the semi-transmitting pattern and having an effect to block the activating rays to an extent not to cure the liquid resin layer.

3 Claims, 11 Drawing Figures

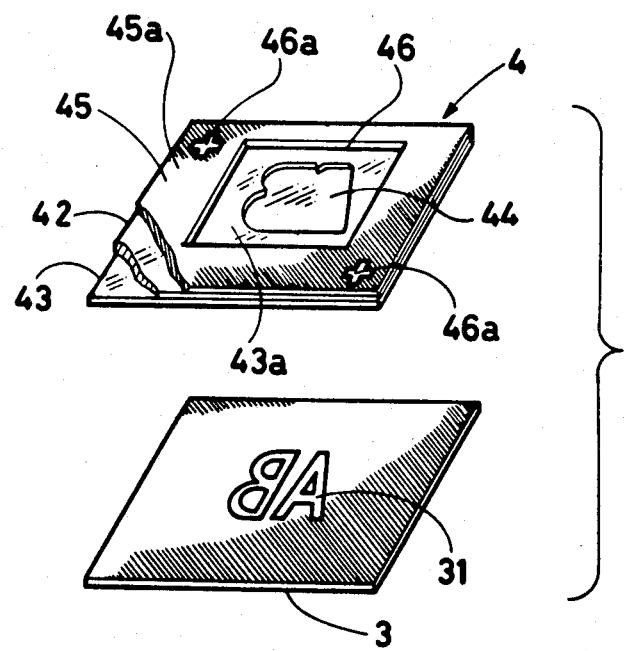
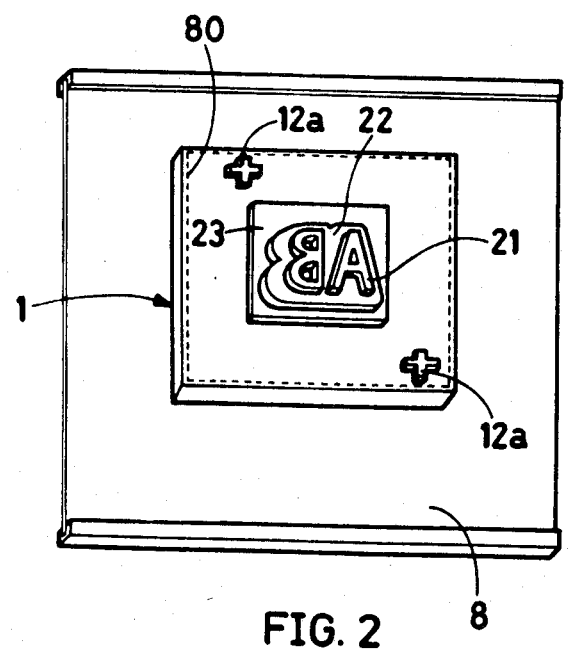
FIG. 1
FIG. 2

RESIN PRINTING PLATE AND PREPARATION THEREOF

This application is a divisional of copending application Ser. No. 690,550 filed on Jan. 11, 1985.

FIELD OF INDUSTRIAL APPLICATION

The present invention relates to printing plates prepared from a liquid resin which is sensitive to and curable by irradiation with activating rays, such as ultraviolet rays, radiation and ultrared rays, a process for preparing such printing plates, and a masking sheet for practicing the process.

BACKGROUND OF THE INVENTION

Photosensitive urethane liquid resin (brand name "APR," product of Asahi Chemical Industry Co., Ltd.) which is preservable in a liquid state but is curable when subjected to an external stimulus such as irradiation with ultraviolet rays has been recently used for preparing printing plates for printing newspapers and producing prints on corrugated boards.

Such printing plates are prepared by the steps shown in FIGS. 8 to 11.

The conventional process will be described for preparing a printing plate 1 for printing on a corrugated board, for example, the mark "AB" as shown in FIG. 6. (The mark appears as a reversed mark on the surface of the printing plate.)

FIG. 7 shows a negative film 3 and a masking sheet 4 for use in preparing the printing plate 1. A light transmitting pattern 31 corresponding to the mark is formed on the negative film 3. A surface for completely blocking light is formed over the hatched portion of the negative film 3 except the pattern 31.

The masking sheet 4 comprises a transparent film and a light blocking film removably affixed to the film. The light blocking film is cut out to form a light transmitting pattern 41 corresponding to and slightly larger than the light transmitting pattern 31 on the negative film 3. The other portion of the light blocking film indicated by hatching has a surface for completely blocking light.

Step a: The negative film 3 is placed on a transparent base plate 5, and a protecting transparent film 6 is placed over the negative film 3 as shown in FIG. 8.

Step b: A frame 7 serving as a barrier for a photosensitive liquid resin is placed along the outer periphery of the transparent film 6 to surround the entire negative film 3. The liquid resin is poured onto the transparent film 6 inside the frame 7 to form a photosensitive liquid resin layer 2 (FIG. 8).

Step c: A transparent base film 11 is placed over the surface of the liquid resin layer 2, and the masking sheet 4 is placed over the base film 11 (FIG. 8).

Step d: The resulting assembly is irradiated by ultraviolet lamps 51, 51 from outside the masking sheet 4 and the transparent base plate 5 to expose the liquid resin layer 2 to the light as shown in FIG. 9. In corresponding relation to the patterns 41, 31 of the masking sheet 4 and the negative film 3, the exposed portions of the resin layer start curing, while the unexposed portions remain liquid. The cured resin portion toward the negative film 3 becomes a relief portion 21 conforming to the mark. The cured resin portion toward the masking sheet 4 makes a mount portion 22 continuous with the relief portion 21 and having an increased width to reinforce the portion 21.

Step e: The masking sheet 4 is removed, and the resin layer is exposed to the light again for a short period of time from outside the base film 11 as seen in FIG. 10 to cure the entire upper surface of the resin layer to a small thickness and form a base portion 23 which is joined with the base film 11.

Step f: The frame 7 and the transparent film 6 are removed, and the uncured liquid resin is collected.

As shown in FIG. 11, each relief portion 21 is reinforced by the mount portion 22, which is continuous with the base portion 23 covering approximately over the entire surface of the base film 11. Thus, the printing plate 1 is formed.

The printing plate 1 has a double-layer structure in which the resin base portion 23 uniformly covers the base film 11. The printing plate 1 is cut to a suitable size including the relief portions 21, the mount portions 22 and matching marks 12, fixed in position to a transparent mount film 8 for a printing machine and then removably attached to the rotary drum of the printing machine.

TECHNICAL PROBLEMS

It is required that the photosensitive liquid resin, which is expensive, be used in a minimized amount. However, since the base portion 23 is formed over the entire surface of the base film 11, the printing plate 1 prepared by the conventional process inevitably requires use of an increased amount of photosensitive liquid resin. The process therefore has the problem of being costly to practice.

Furthermore, the printing plate 1 must be provided with the matching marks 12 for fixing the plate 1 to the mount film 8 in position. Accordingly it has been conventional practice to form on the negative film 3 light transmitting patterns 32 corresponding to the matching marks 12, to form in the masking sheet 4 light transmitting patterns 47 of larger contour for forming mount portions for the matching marks as seen in FIG. 7, and to form the matching marks 12 simultaneously with the relief portions 21. Consequently the matching marks 12 are formed invariably at the same level as the relief portions 21.

After the printing plate 1 has been attached to the mount film 8, it is therefore necessary to cut the matching marks 12 to a lower level than the relief portions 21 to prevent the printing ink from adhering to the marks 12.

This procedure involves problems. It is cumbersome, while the printer is likely to leave the matching marks 12 uncut without noticing them if the relief portion 21 of the printing plate is complicated. Conversely the printer is likely to erroneously cut the relief portion as well as the matching mark.

The printing plate is attached to the mount film as placed in position, usually by affixing an adhesive tape 13 to peripheral portions of the printing plate which is held to the mount film to hold the plate base portion to the film as shown in FIG. 6, or by affixing a double-faced adhesive tape to the rear surface of the printing plate first and pressing the plate against the mount film as placed thereon.

Nevertheless, these methods involve the likelihood that if the adhesive tape has low bond strength, the printing plate will be separated from the mount film by a centrifugal force which acts on the printing plate during high-speed printing. Further it is likely for the printer to clean the surface of the printing plate to remove the ink after printing and stow the plate 1 as attached to the mount film for reuse. In this case, the cleaning water will penetrate into the space between the printing plate and the mount film and remain therein, with the result that the water flows out during the subsequent printing operation to stain the surface of the print. Although it was attempted to attach the printing plate to the mount film by joining them together by a high-frequency welder, use of the high-frequency welder is infeasible because the mount film is made of polyester, while the printing plate is uniformly covered with the base portion of urethane resin.

SUMMARY OF THE INVENTION

An object of the present invention is to provide a printing plate which comprises a base portion, a mount portion and a relief portion made of a photosensitive resin and which can be attached to a mount film by joining with a high-frequency welder and to provide a process for preparing the printing plate.

Another object of the invention is to provide a process for preparing such a printing plate with a greatly reduced amount of photosensitive liquid resin.

Another object of the invention is to provide a masking sheet which is directly used for practicing the above process.

According to the present invention, the masking sheet to be described below is used for performing the above step d following the steps a to c of the conventional process.

The masking sheet comprises a film plate for passing activating rays and a blocking layer removably formed on the film plate for blocking the passage of activating rays and is adapted to cure the required portion of the photosensitive liquid layer by exposure to activating rays. The blocking layer comprises a first blocking film 43 for transmitting irradiating activating rays upon attenuation, and a second blocking film 45 by which the activating rays irradiating the masking sheet are blocked to such an extent that the liquid resin will not be cured. The first and second blocking films are removably affixed to opposite surfaces of the film plate separately, or to one surface thereof as superposed thereon.

The first blocking film 43 has a cutout transmitting pattern 44 having a contour conforming to and slightly larger than the pattern 31 on the negative film 3. The second blocking film 45 has a cutout transmitting pattern 46 having a larger contour than the transmitting pattern of the first blocking film 43.

The liquid resin layer is cured by being irradiated with activating rays from above the masking sheet and from below the negative film, whereby a printing plate is obtained which comprises a base portion formed on the base film and matching the transmitting pattern of the second blocking film, a mount portion matching the pattern of the first blocking film and a relief portion matching the pattern on the negative film. The base film has an exposed surface outside the base portion.

According to the present invention, the uncured liquid resin is removed from the base film after the irradiation for recovery, so that the recovered resin is reusable. Since the amount of liquid resin corresponding to the complete blocking surface of the masking sheet is entirely collected to leave the corresponding portion of the base film exposed, an increased amount of resin can be collected to assure a saving in the resin.

Further the mount portion and the base portion can be formed at the same time by exposing the masked assembly to activating rays only once, whereas the assembly is conventionally exposed to rays first with the masking sheet on and next with the masking sheet removed to form the mount portion and the base portion by separate steps. The present process is therefore simplified to give printing plates efficiently.

The masking sheet 4 is partly formed with light transmitting portions 46a in conformity with the matching marks 12a, so that the rays passing through the transmitting portions 46a reach the liquid resin layer partially through the semi-light-blocking surface 43a, whereby matching marks 12a are formed on the base film at the same level as the above-mentioned base portion 23.

Because the matching marks 12a thus formed are lower than the relief portions representing the mark "AB", there is no likelihood that the printing ink will adhere to the matching marks. This eliminates the procedure heretofore needed for cutting the matching marks.

The printing plate is completed with the base film exposed around the base portion 23 as seen in FIG. 2, so that the printing plate can be attached to a mount film easily by placing the printing plate in position on the mount film and welding the base film to the mount film along the outer periphery of the base film by a high-frequency welder, because both of these films are of the same material, i.e. polyethylene. Moreover, a turn of weld line 80 which can be formed along the outer periphery of the printing plate overcomes the problem heretofore encountered that cleaning water will penetrate into the space between the printing plate and the mount film.

BRIEF DESCRIPTION OF THE DRAWINGS

FIG. 1 is a perspective view showing a negative film and a masking sheet for use in the process of the present invention;

FIG. 2 is a perspective view showing a printing plate of the invention as attached to a mount film;

DETAILED DESCRIPTION OF THE INVENTION

Printing plate

FIG. 2 shows a printing plate 1 of the invention as attached along its outer periphery to a mount film 8 by high-frequency welding.

Figure 5:
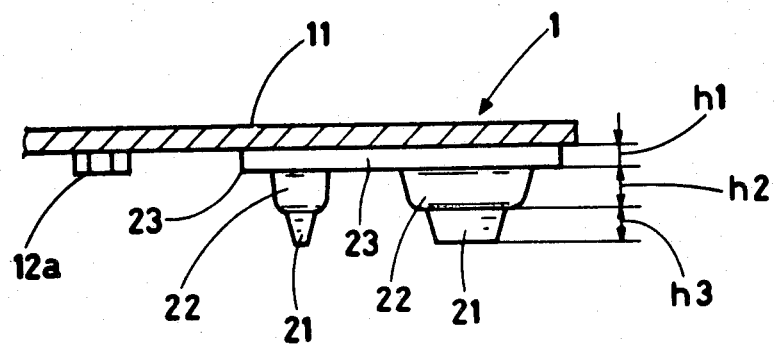
FIG. 5 is a view in section showing the printing plate of the invention.
Figure 6:
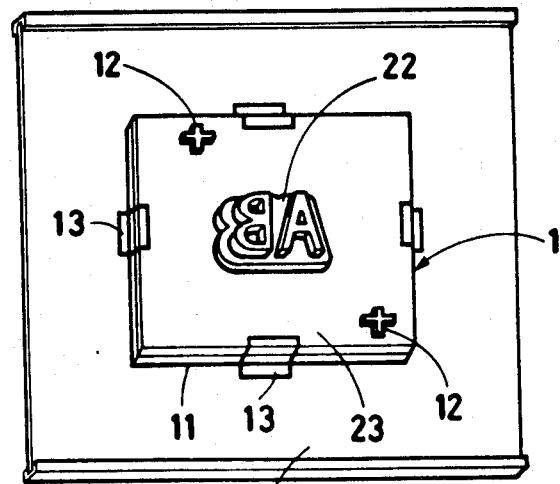
FIG. 6 is a perspective view showing a conventional printing plate as attached to a mount film.
Figure 7:
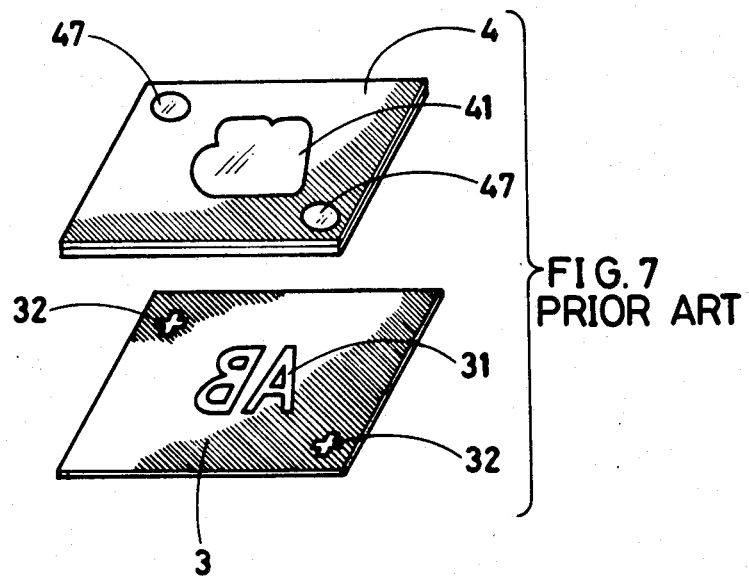
FIG. 7 is a perspective view showing a conventional masking sheet and negative film.
Figure 8:
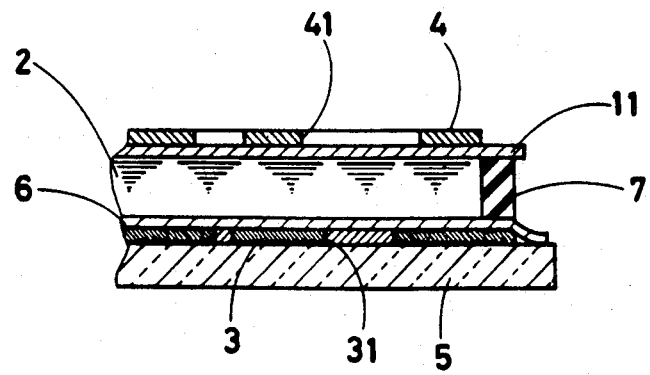
FIGS. 8, 9 and 10 are diagrams showing a conventional process.
Figure 9:
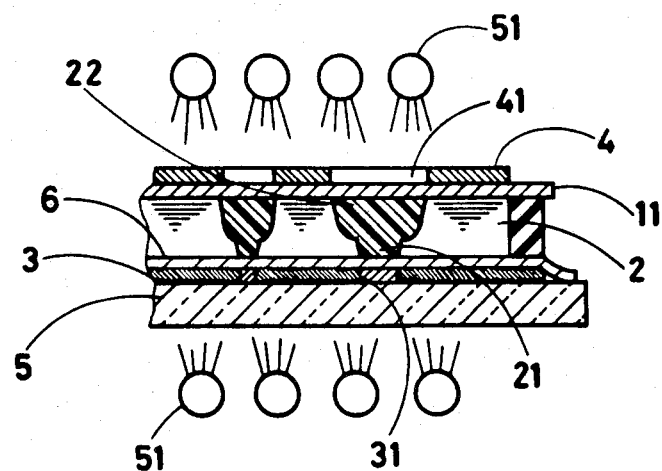
Figure 10:
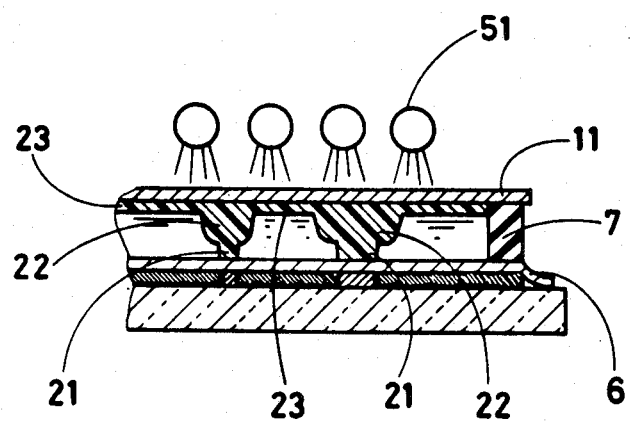
Figure 11:
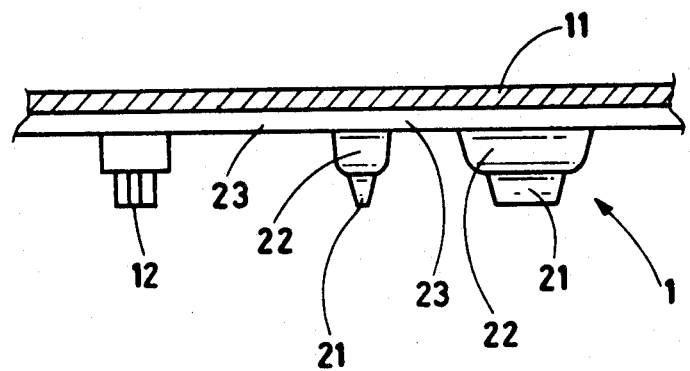
FIG. 11 is a sectional view showing the printing plate prepared by the conventional process.

The printing plate 1, like the conventional one already described, has relief portions 21, 21 representing the mark "AB" in a raised form. As seen in FIG. 5, each relief portion 21 is formed on a mount portion having a slightly larger contour than the portion 21. The mount portion 22 is formed on a base portion 23 having a large area and surrounding the mount portion 22.

The base portion 23 is firmly bonded to a base film 11 of polyester by the adhesion of the resin itself, or by the adhesion of an adhesive which is applied to the base film when so required. For printing on corrugated boards, the printing plate 1 is preferably about 2.0 mm in the thickness $h_1$ of the base portion 23, about 2.5 mm in the thickness $h_2$ of the mount portion 22 and about 2 mm in the thickness $h_3$ of the relief portion 21.

The base film 11 remains exposed as it is at the portion of the printing plate 1 where the base portion 23 is not formed. Positioning matching marks 12a formed on the exposed portion of the base film are at the same level as the base portion 23.

The printing plate is fixedly attached to the mount film by placing the plate in position on the mount film with reference to the matching marks of the plate and welding the exposed base film portion to the mount film by a known high-frequency welder.

Production process

The printing plate 1 is produced by the following process.

FIG. 1 shows a negative film 3 and a masking sheet 4 useful for preparing the printing plate 1.

The masking sheet 4 comprises a semi-light-blocking first blocking film 43 affixed to one surface of a transparent film 42 for passing ultraviolet rays upon attenuation, and a second blocking film 45 provided on the other surface of the film 42 for blocking ultraviolet rays to such an extent that the rays will not cure the liquid resin used. The films 43, 45 are removably adhered to the film 42 with an adhesive.

The second blocking film 45 has properties to completely block light by itself, or is equal to or higher than the first blocking film in ultraviolet attenuation ratio, such that when ultraviolet rays pass through both the first and second blocking films, the rays are attenuated and blocked almost completely by the two films.

The negative film 3 has a complete light blocking surface as indicated by hatching, except where a light transmitting pattern 31 is formed in corresponding relation to the mark "AB". It is noteworthy that light transmitting portions corresponding to the matching marks 12a on the printing plate 1 are not formed on the negative plate 3 but are formed by cutting out only in the complete light blocking surface of the masking sheet at suitable positions as indicated at 46a.

The first blocking film 43 is formed with a light transmitting cutout pattern 44 having a contour corresponding to and slightly larger than the pattern 31 of the negative film 3. The second blocking film is formed with a light transmitting cutout pattern 46 having a larger contour than the light transmitting pattern 44 of the semi-light-blocking film 43.

The light transmitting patterns 44, 46a are formed by forming a cut line in the first and second blocking films 43, 45 to the depth of the transparent film 42 in conformity with the patterns 44, 46a and removing the inside portion of the cut line from the transparent film 42.

The semi-light-blocking film 43 transmits about 10 to about 15% of the amount of exposure.

Figure 3:
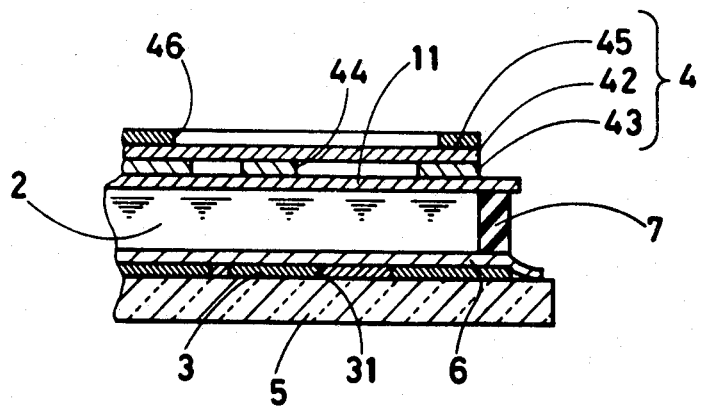
FIGS. 3 and 4 are diagrams showing steps of the process of the invention.

First step:

The negative film 3 is placed on a transparent base plate 5, and a transparent film 6 is placed over the negative film 3 as shown in FIG. 3. A generally rectangular frame 7 is placed on the transparent film 6 along its outer periphery. A photosensitive liquid resin is poured into the interior of the frame 7 to form a photosensitive liquid resin layer 2.

Second step:

A transparent base film 11 is placed over the liquid resin layer 2, and the masking film 4 is further placed over the film 11. When required, a transparent adhesive (not shown) having good adhesion to the photosensitive resin is applied to the lower surface of the transparent base film 11 in advance.

Figure 4:
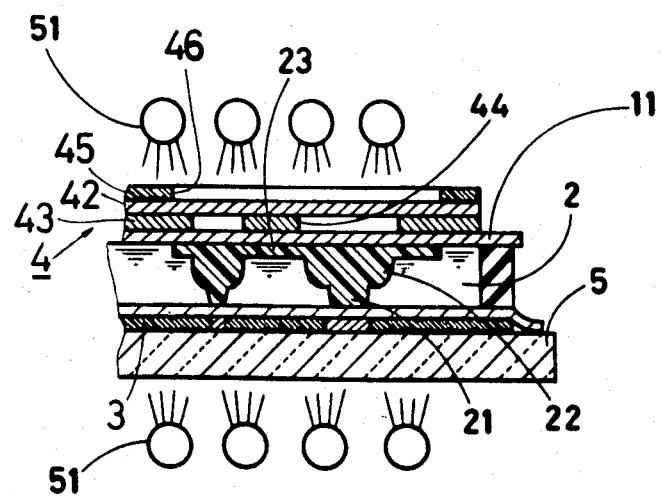

Third step:

As shown in FIG. 4, the resulting assembly is irradiated by light sources 51 from outside the transparent base sheet 5 and the masking sheet 4 to expose the resin to the light for 380 to 400 seconds.

When exposed, the lower portion of the resin layer is cured in corresponding relation to the pattern 31 of the negative film 3 to form relief portions 21.

Toward the masking sheet 4, on the other hand, the liquid resin layer 2 is cured to a large thickness in corresponding relation to the light transmitting patterns 44, 46 of the first and second blocking films 43, 45 to form mount portions 22 integral with the relief portions 21. Where the light through the pattern 46 passes through the first blocking film, i.e. semi-light-blocking film 43, and is thereby attenuated, the upper portion of the resin layer is cured to a small thickness in corresponding relation to the pattern 46 to make a base portion 23 which is integral with the mount portions 22.

The base portion 23 is firmly joined to the base film 11 by the adhesion of the resin itself or by the adhesive applied to the base film 11 in advance.

The resin layer is exposed to light first from outside the masking sheet 4, and upon lapse of about ⅔ of the required exposure time after the start of exposure, the resin layer is exposed to light from the negative film side. Upon lapse of the required exposure time, the exposure is discontinued for each side individually.

When the exposure from the negative film side is thus preceded by the exposure from the masking sheet side, the mount portion 22 and the base portion 23, which serve as a foundation for the relief portion 21, are formed before the relief portion 21, with the result that the relief portion 21 can be formed integrally with the mount portion 22 with good stability.

Although the exposure from the negative film side can be started after the completion of exposure from the masking sheet side, a time loss will then occur.

The exposure time is optimally determined according to the thickness of the printing plate and the intensity of light.

Fourth step:

The masking sheet 4, the frame 7 and the transparent film 6 are removed, and the uncured liquid resin is collected, whereby the printing plate 1 of the invention is completed.

While an embodiment of the present invention has been described above with reference to the drawings, various modifications and alterations can of course be made by one skilled in the art within the technical scope defined in the appended claims.

What is claimed is:

1. A printing plate comprising a base portion formed from a photosensitive curable resin on a transparent base film, a mount portion formed on the base portion and having a contour corresponding to and larger than a printing pattern, and a relief portion formed on the mount portion and corresponding to the printing pattern, the printing plate being characterized in that the base portion is formed around the mount portion, the base film being exposed outside the base portion.

2. A printing plate as defined in claim 1 wherein the exposed surface of the base film is formed with matching marks approximately at the same level as the base portion for positioning the printing plate in place when the printing plate is to be attached to a mount film.

3. A printing plate as defined in claim 1, further comprising a mount film thermally fused to the base film along the periphery of the exposed portion of the base film.

* * * * *